(12) United States Patent
Baik et al.

(10) Patent No.: US 6,841,863 B2
(45) Date of Patent: Jan. 11, 2005

(54) BALL GRID ARRAY PACKAGE WITH STACKED CENTER PAD CHIPS AND METHOD FOR MANUFACTURING THE SAME

(75) Inventors: Hyung Gil Baik, Kyoungki-do (KR); Ki Ill Moon, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 55 days.

(21) Appl. No.: 10/331,004

(22) Filed: Dec. 27, 2002

(65) Prior Publication Data

US 2003/0205801 A1 Nov. 6, 2003

(30) Foreign Application Priority Data

May 3, 2002 (KR) .................................. 10-2002-0024325

(51) Int. Cl.[7] .............................................. H01L 23/48
(52) U.S. Cl. ...................... 257/686; 257/777; 257/685; 257/723; 257/666; 257/673; 257/698; 257/696; 257/684; 257/796; 257/737; 257/738; 257/784; 257/786
(58) Field of Search .............................. 257/686, 685, 257/723, 777, 737, 738, 784, 786, 662, 673, 692, 698, 67, 668

(56) References Cited

U.S. PATENT DOCUMENTS

| | | | |
|---|---|---|---|
| 5,332,922 A | * | 7/1994 | Oguchi et al. ............... 257/723 |
| 6,093,969 A | * | 7/2000 | Lin ............................. 257/777 |
| 6,190,944 B1 | * | 2/2001 | Choi ........................... 438/109 |
| 6,344,401 B1 | | 2/2002 | Lam |
| 6,348,363 B1 | | 2/2002 | Chung et al. |
| 6,451,626 B1 | | 9/2002 | Lin |
| 6,583,502 B2 | * | 6/2003 | Lee et al. ................... 257/866 |
| 2001/0006258 A1 | * | 7/2001 | Hur ............................. 257/777 |

* cited by examiner

Primary Examiner—Alexander Oscar Williams
(74) Attorney, Agent, or Firm—Ladas & Parry

(57) ABSTRACT

Disclosed is a ball grid array package with stacked center pad chips, which realizes a BGA package with stacked chips using center pad type semiconductor chips, and a method for manufacturing the same. The semiconductor chips are glued on each of upper and lower circuit boards, which have active surfaces facing each other; the chip pads are connected to each of the upper and lower circuit boards with gold wires; the upper and lower circuit boards are joined together with bumps interposed between them for electrical connection; the upper circuit board is included in a package mold; and the opposite ends of the lower circuit board are exposed to the lower portion of the package mold. The lower circuit board can be made of flexible insulation film. The exposed opposite ends of the lower circuit board can have solder balls formed thereon. Also, the opposite ends of the lower circuit board may be joined to a printed circuit board. Solder balls may be formed on the lower surface of the printed circuit board. The upper circuit board may be composed of a lead frame. The package according to the present invention is a stacked package capable of increasing memory capacity of a single package by at least 200% and combining both advantages of FBGA packages and of center pad type semiconductor chips.

6 Claims, 6 Drawing Sheets

BALL GRID ARRAY PACKAGE WITH STACKED CENTER PAD CHIPS AND METHOD FOR MANUFACTURING THE SAME

BACKGROUND OF THE INVENTION

1. Field of the Invention

The present invention relates to a semiconductor package, and more particularly to a ball grid array package with stacked center pad chips, which realizes a stacked package of a Fine Ball Grid Array (FBGA) type by stacking more than one center pad type semiconductor chips, and a method for manufacturing the same.

2. Description of the Prior Art

In the semiconductor industry, packaging technology for IC chips is continuously progressing in order to meet the desire for compactness and improved mounting reliability. Furthermore, as the performance of electronic devices is getting better, efforts have been made to mount a larger number of semiconductor packages on a substrate having a limited size. As a result of such efforts, there has been proposed a so-called "stacked package".

The stacked package was devised in order to increase memory capacity by stacking memory chips of a same size and function or to maximize the performance and efficiency of products by assembling various kinds of semiconductor chips with different size and function. There are many types of stacked packages according to the corresponding end-use products, makers, etc. One example of stacked packages according to the prior art is illustrated in FIG. 1.

Figure 1:
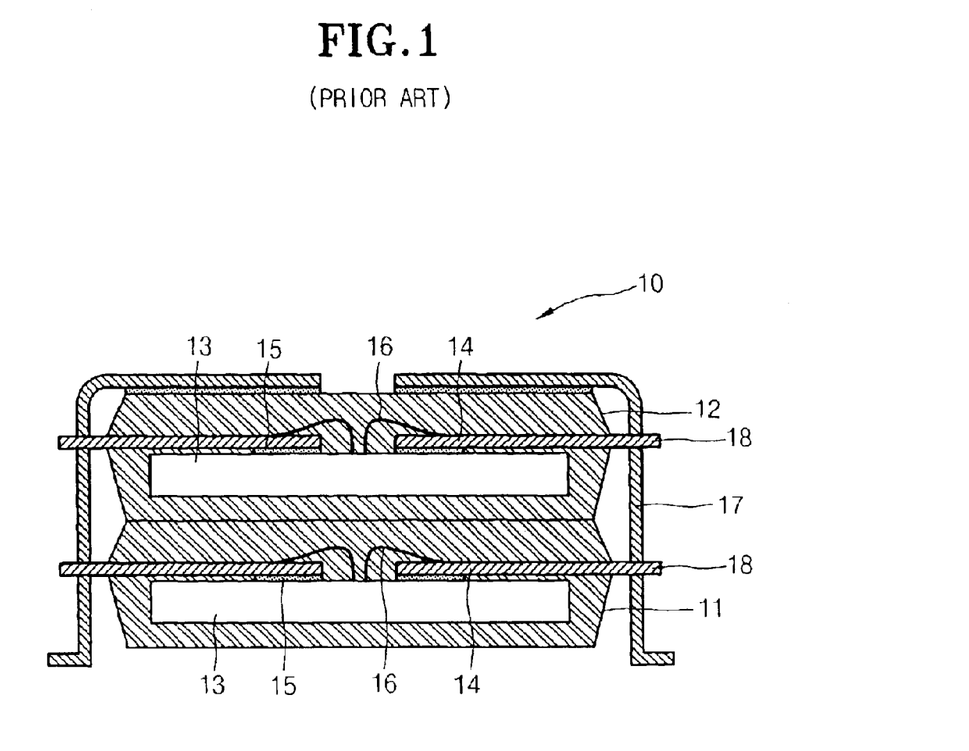
FIG. 1 is a sectional diagram showing an example of a stacked package according to the prior art.

The stacked package shown in FIG. 1 belongs to a package-stacking type. In other words, the stacked package is constructed by stacking individual packages 11, 12 and classified as a Thin Small Outline Package (TSOP) type. Each of the individual packages 11, 12 in FIG. 1 comprises a semiconductor chip 13 therein and uses a Lead-on-Chip (LOC) lead frame. The lead frame has an internal lead 14 glued on the upper surface of the semiconductor chip 13 by an adhesive tape 15 and connected therewith electrically by a gold wire 16. The stacked packages 11, 12 are connected together electrically by a separate connecting lead 17. The connecting lead 17 is joined to each outer lead 18 of the respective lead frames and acts as an outer connection terminal of the stacked package 10.

However, because of their large mounting area and considerable height, stacked packages 10, as mentioned above, are hardly applicable to such systems as information communication devices, which require compactness and thinness. They are not suitable for high-speed devices either, since they use lead frames 14, 17, 18. Moreover, as the path between a mounting point and the semiconductor chip 14 of the upper package 12 is longer than the path between the mounting point and the semiconductor chip 13 of the lower package 11, there exists a difference in electrical characteristics.

Figure 2:
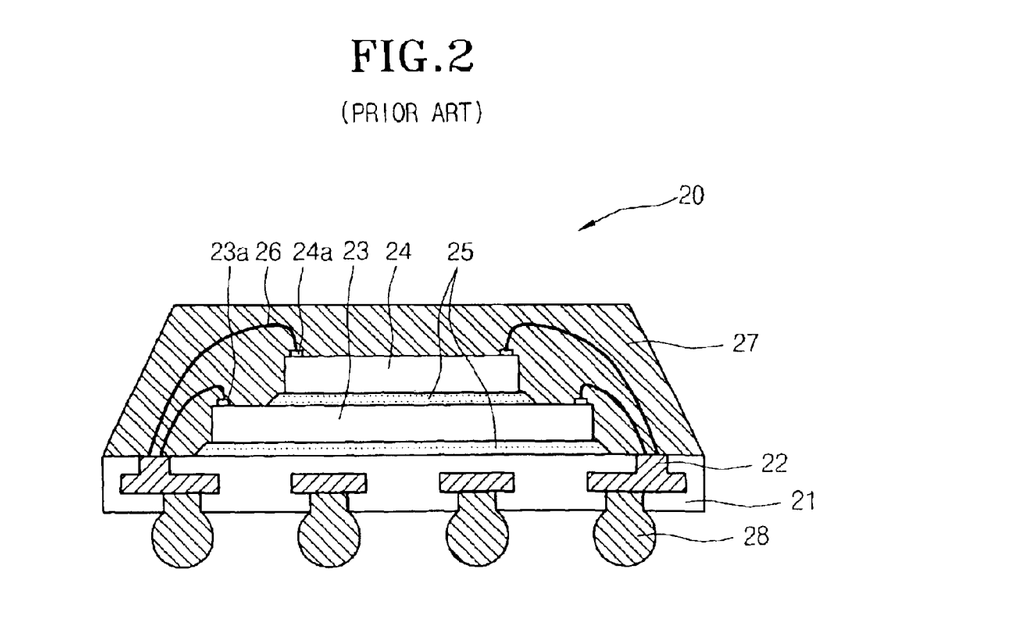
FIG. 2 is a sectional diagram showing an example of a BGA package with stacked chips according to the prior art.

Accordingly, a Ball Grid Array (BGA) package using solder balls as outer connection terminals has been proposed, for the purpose of improving electrical characteristics by minimizing both the surface mounting area of a semiconductor package and the electrical connection length thereof. Referring to FIG. 2, there is illustrated a so-called "BGA package with stacked chips", which has been basically configured as a BGA package and has semiconductor chips stacked therein.

As shown in FIG. 2, individual semiconductor chips 23, 24 are stacked within the package mold 27 of the BGA package with stacked chips 20. Instead of lead frames, a printed circuit board (PCB) 21 and solder balls 28 are used in the package 20. The lower semiconductor chip 23 is glued on the PCB 21 having wirings 22 attached thereon with adhesives 25, and then the upper semiconductor chip 24 is glued on the lower semiconductor chip 23. Each of the semiconductor chips 23, 24 is connected electrically with the wirings 22 of the PCB 21 by means of gold wires 26. The PCB 21 is provided with solder balls 28 on its lower surface for electrical connection with the wirings 22. The solder balls 28 act as outer connection terminals for the package 20.

However, the BGA packages with stacked chips, as explained above, can use nothing but semiconductor chips of a so-called "side pad type". On the active surfaces of semiconductor chips such as DRAM chips, a number of chip pads 23a, 24a are formed for performing input/output with external elements. If the chip pads 23a, 24a are formed on the edges of the active surfaces of semiconductor chips, the chips are said to be semiconductor chips of the side pad type 23, 24.

Recently, a semiconductor chip of a so-called "center pad type" has been generalized, having chip pads formed along the center of active surfaces of the chips, since the center pad type is more advantageous for implementation in a high speed device. Meanwhile, BGA packages with stacked chips 20 according to the prior art, as shown in FIG. 2, have a defect in that they cannot use center pad type semiconductor chips because of the difficulty in stacking chips and the increased length of gold wires. BGA packages with stacked chips 20 are also vulnerable to a warpage phenomenon, since thermal stress can become concentrated in the upper portion of the package.

As a result, only one center pad type semiconductor chip can be implemented in a BGA package, according to the prior art. An example of a BGA package with a center pad chip is illustrated in FIG. 3.

Figure 3:
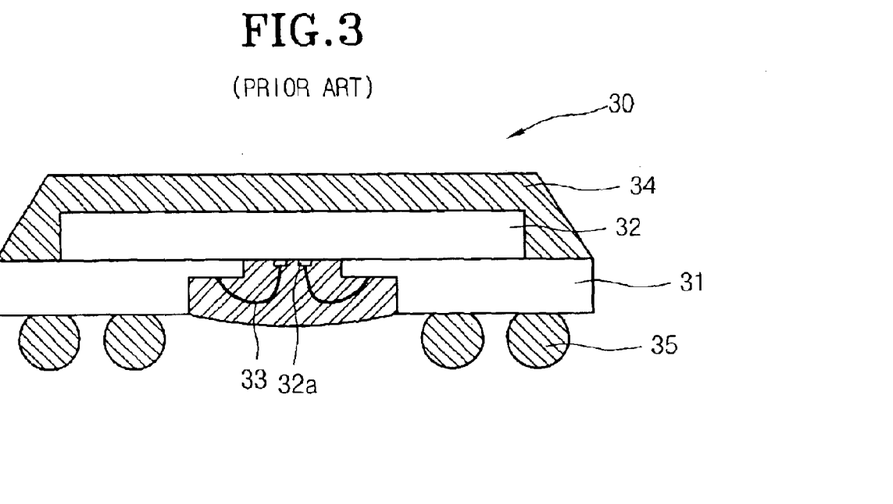
FIG. 3 is a sectional diagram showing an example of a BGA package with a center pad chip according to the prior art.

As illustrated in FIG. 3, a BGA package with a center pad chip 30 is constructed by gluing the active surface of a semiconductor chip 32, having a chip pad 32a formed thereon, on a circuit board 31 and connecting the semiconductor chip 32 with the circuit board 31 using gold wires 33. A package mold 34 protects the semiconductor chip 32 and the gold wires 33. Solder balls 35, acting as outer connection terminals, are formed on the circuit board 31.

As explained above, stacked packages, BGA packages and center pad type semiconductor chips all have their own advantages. However, it has been considered very difficult to implement a package that combines all the advantages of the stacked packages, BGA packages and center pad type semiconductor chips, from the viewpoint of structure, manufacturing cost and process stability.

SUMMARY OF THE INVENTION

Accordingly, the present invention has been made to solve the above-mentioned problems occurring in the prior art, and an object of the present invention is to provide a new ball grid array package with stacked center pad chips, being capable of combining all the advantages of stacked packages, FBGA packages and center pad type semiconductor chips, as well as a method for manufacturing the same.

In order to accomplish this object, there is provided a ball grid array package with stacked center pad chips, implemented by stacking two center pad type semiconductor chips having chip pads formed along the center of the active surfaces of each chip. The package according to the present invention is characterized in that the semiconductor chips are glued on both of two upper and lower circuit boards having active surfaces facing each other, in that the chip pads are connected to the upper and lower circuit boards respectively with gold wires, in that the upper and lower circuit boards are joined together with bumps interposed between them for electrical connection, in that the upper circuit board is included in a package mold, and in that the opposite ends of the lower circuit board are exposed to the lower portion of the package mold.

The lower circuit board can be made of flexible insulation film. The exposed opposite ends of the lower circuit board can have solder balls formed thereon. Also, the opposite ends of the lower circuit board may be joined to a printed circuit board. Solder balls may be formed on the lower surface of the printed circuit board. The upper circuit board may be composed of a lead frame.

According to another aspect of the present invention, there is provided a method for manufacturing a ball grid array package with stacked center pad chips by stacking two center pad type semiconductor chips having chip pads formed along the center of active surfaces of each chip. The method comprises the steps of: gluing the semiconductor chips on both of two upper and lower circuit boards having active surfaces facing each other; connecting the chip pads to the upper and lower circuit boards respectively with gold wires; joining the upper and lower circuit boards together with bumps interposed between them for electrical connection; and forming a package mold by including the upper circuit board in the package mold and exposing the opposite ends of the lower circuit board to the lower portion of the package mold.

According to still another aspect of the present invention, there is provided a method for manufacturing a ball grid array package with stacked center pad chips by stacking two center pad type semiconductor chips having chip pads formed along the center of active surfaces of each chip, comprising the steps of: providing upper and lower circuit board strips forming a number of upper and lower circuit boards, the strips having holes and windows formed at a constant interval, as well as board pads, wirings and connection pads each formed in a constant pattern, the wirings extending into the holes of the lower circuit boards to form ball lands, and the connection pads having bumps formed thereon; gluing the semiconductor chips on each of the circuit boards of the circuit board strips so that the chip pads are exposed through the windows; connecting the exposed chip pads to the board pads electrically with gold wires; gluing the upper and lower circuit boards each other so that the semiconductor chips face each other and the upper and lower circuit boards are connected electrically via the bumps; forming a package mold exposing the ball lands of the lower circuit board by pressing the ball lands through the holes so that the wirings, which have extended into the holes of the lower circuit boards, are bent downward; forming solder balls on the ball lands; and separating the circuit board strips into respective packages.

Preferably, the step of forming a package mold comprises the steps of: providing the upper and lower circuit board strips in a molding apparatus composed of upper and lower molding dies so that each of the circuit boards is positioned within the cavities of the molding apparatus; pressing the ball lands of the lower circuit boards with pressing portions formed on the upper molding die through the holes of the circuit board strips until the ball lands contact the lower molding die; and injecting liquefied molding resin into the cavities through injection openings of the molding apparatus and curing the resin to form a package mold.

BRIEF DESCRIPTION OF THE DRAWINGS

The above and other objects, features and advantages of the present invention will be more apparent from the following detailed description taken in conjunction with the accompanying drawings, in which:

FIGS. 5 through 8 are process diagrams showing a method for manufacturing the ball grid array package with stacked center pad chips shown in FIG. 4:

DETAILED DESCRIPTION OF THE PREFERRED EMBODIMENTS

Hereinafter, preferred embodiments of the present invention will be described with reference to the accompanying drawings. In the following description and drawings, the same reference numerals are used to designate the same or similar components, and so repetition of the description on the same or similar components will be omitted. Some components in the drawings are somewhat exaggerated or depicted approximately for clarity of understanding, and so they do not reflect their actual size.

First Embodiment

Figure 4:
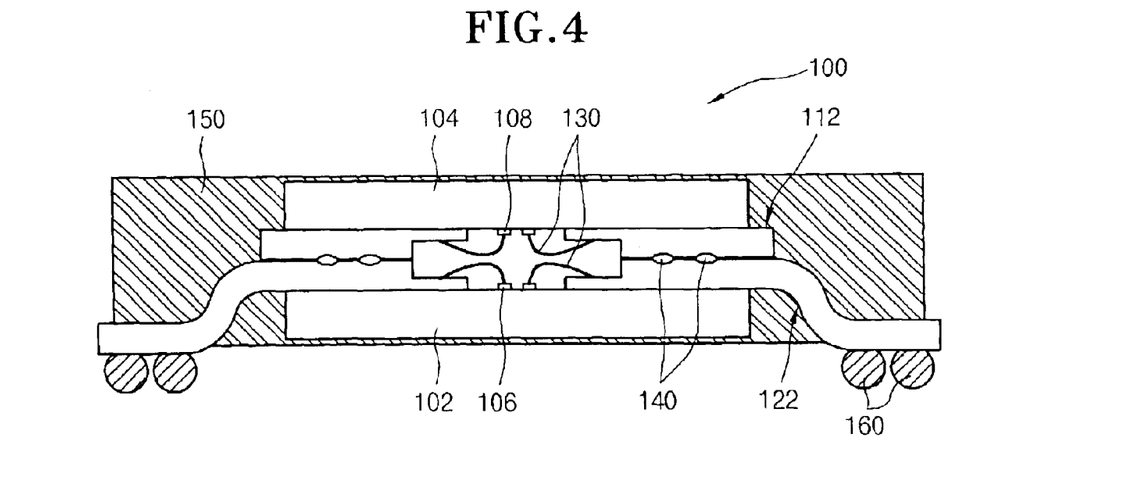
FIG. 4 is a sectional diagram showing a ball grid array package with stacked center pad chips according a first embodiment of the present invention.

FIG. 4 is a sectional diagram showing a ball grid array package with stacked center pad chips according to a first embodiment of the present invention. Referring to FIG. 4, a ball grid array package with stacked center pad chips 100 is implemented by stacking two center pad type semiconductor chips 102, 104.

Chip pads 106, 108 of the semiconductor chips 102, 104 are formed along the center of active surfaces of each of the chips. The semiconductor chips 102, 104 are glued on the upper and lower circuit boards 112, 122 respectively, the circuit boards having active surfaces facing each other. The chip pads 106, 108 are connected with gold wires 130 to the upper and lower circuit boards 112, 122 respectively. The upper and lower circuit boards 112, 122 are joined together with bumps 140 interposed between them for electrical connection. The upper circuit board 112 has a size similar to that of the semiconductor chip 104 and is completely included in a package mold 150. The opposite ends of the lower circuit board 122 are exposed to the lower portion of the package mold 150. The exposed opposite ends of the lower circuit board 122 have solder balls 160 formed thereon and act as outer connection terminals of the package 100.

The ball grid array package with stacked center pad chips 100 according to the present embodiment can be manufactured as follows. The construction of the package will also become clearer from the following description of a method for manufacturing it. FIGS. 5 through 8 are process diagrams showing a method for manufacturing the ball grid array package with stacked center pad chips shown in FIG. 4.

Figure 5:
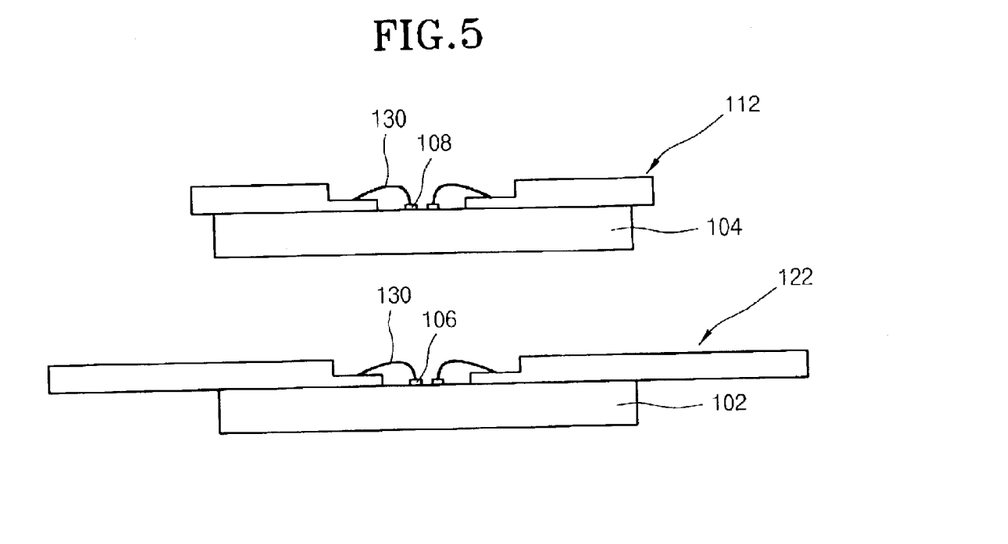
FIG. 5 is a sectional diagram showing semiconductor chips glued on upper and lower circuit boards respectively and connected with wires.
Figure 6:
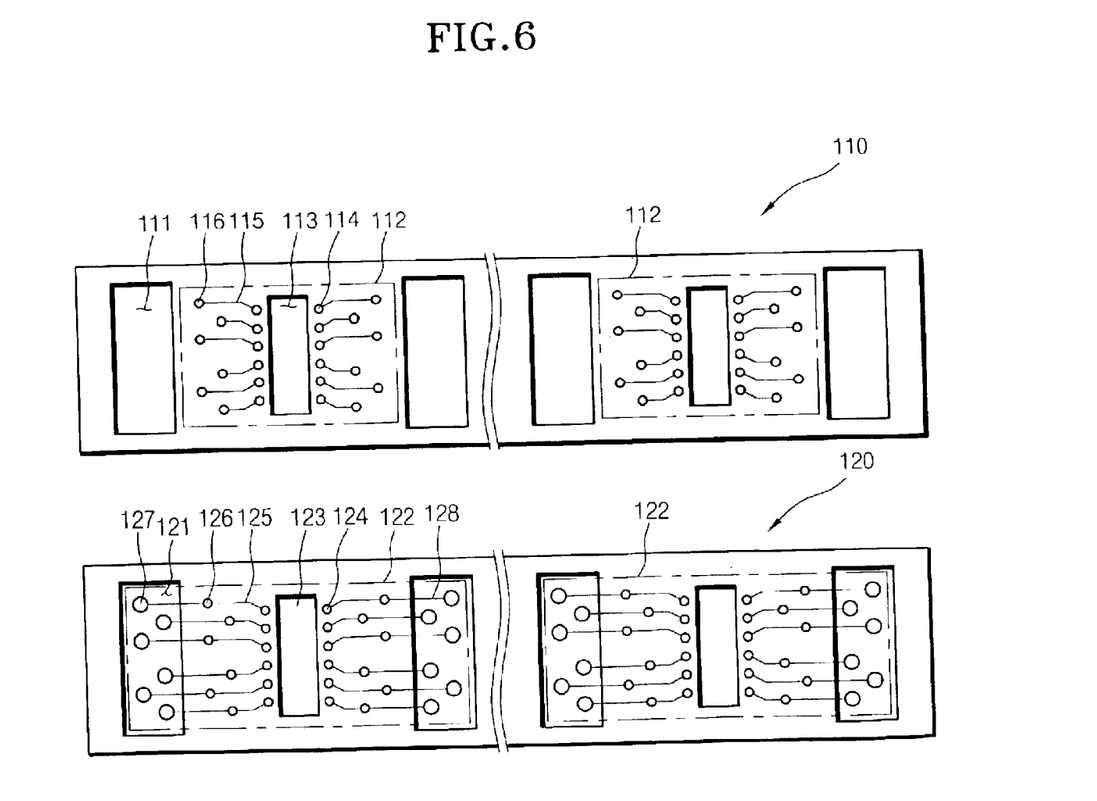
FIG. 6 is a top view diagrammatically showing upper and lower circuit board strips used for the manufacturing method according to the present embodiment.

First, as shown in FIG. 5, semiconductor chips 104, 102 are glued on upper and lower circuit boards 112, 122 respectively and connected with gold wires 130. As shown in FIG. 6, the upper and lower circuit boards 112, 122 take the form of strips 110, 120 respectively.

The circuit board strips 110, 120 are made from reel-shaped insulation film. Holes 111, 121 and windows 113, 123 are formed at a constant interval. Also, board pads 114, 124, wirings 115, 125, 128, connection pads 116, 126 and ball lands 127 are all formed in a constant pattern. Then, a number of circuit boards 112, 122 are formed. In contrast with the upper circuit board strip 110, the lower circuit board strip 120 has a characteristic feature in that wirings 128 are extended into the holes 121 to form ball lands 127. The insulation film is a flexible polymer material. The board pads 114, 124, wirings 115, 125, 128, connection pads 116, 126 and ball lands 127 are made of copper.

Semiconductor chips 104, 102 are glued on each of the circuit boards 112, 122 of the circuit board strips 110, 120. Chip pads 106, 108 of each semiconductor chip 104, 102 are exposed through the windows 113, 123 of the circuit board strips 110, 120. The exposed chip pads 106, 108 are connected to the board pads 114, 124 electrically with gold wires 130. Meanwhile, although not shown in FIGS. 5 and 6, connection pads 116, 126 of at least one of the upper and lower circuit boards 112, 122 have bumps 140 (FIG. 7) formed thereon for connecting the upper and lower circuit boards 112, 122 electrically. Instead of bumps, the connection pads 116, 126 may be plated with solder.

Figure 7:
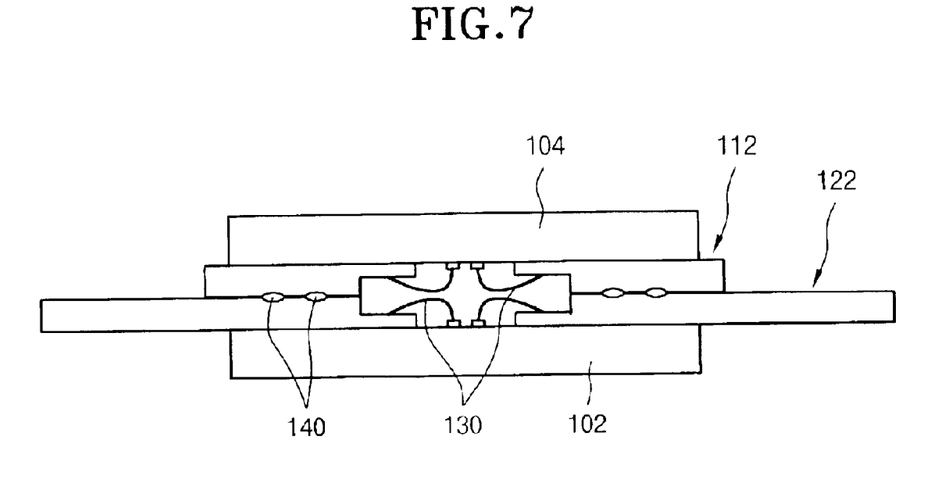
FIG. 7 is a sectional diagram showing upper and lower circuit boards joined together.

Next, as shown in FIG. 7, the upper and lower circuit boards 112, 122 are glued each other so that the semiconductor chips 102, 104 face each other. The upper and lower circuit boards 112, 122 are joined together by applying heat and pressure and are in electrical connection through the bumps 140. Although only a pair of upper and lower circuit boards 112, 122 are shown in FIG. 7, it is preferred that they are glued as parts of the circuit board strips 110, 120, as shown in FIG. 6.

Figure 8:
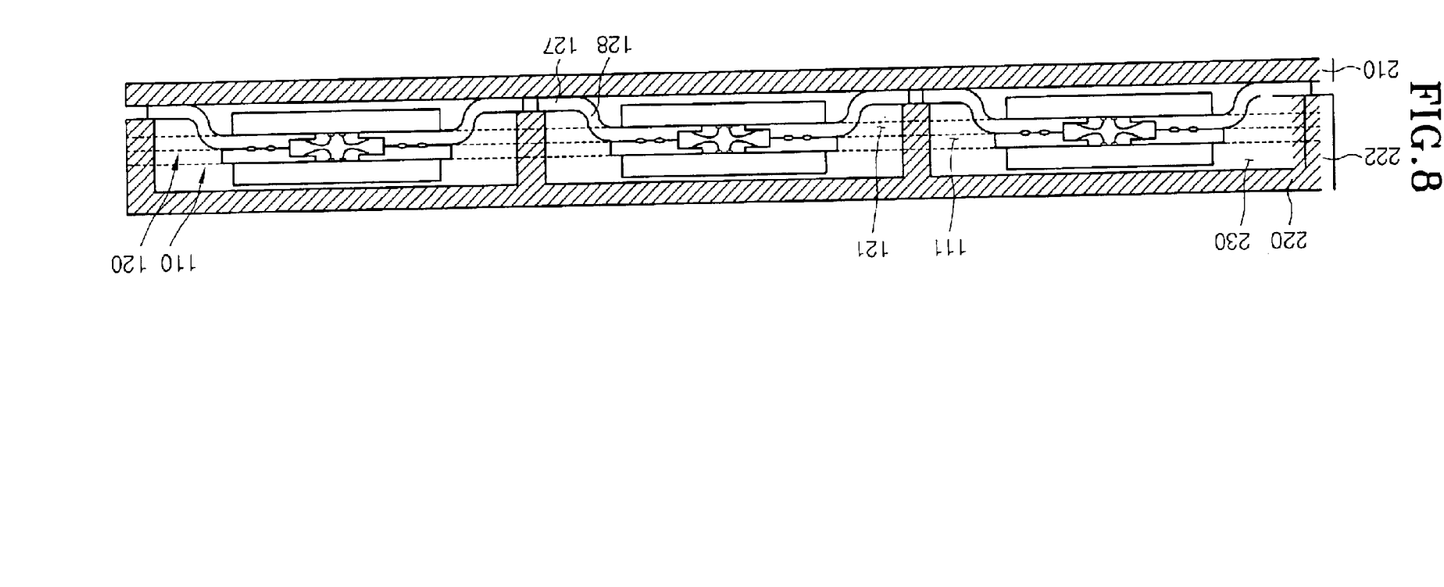
FIG. 8 is a sectional diagram showing a state wherein a molding process is performed while pressing the lower circuit board.

Then, a molding process is performed while pressing the lower circuit board. As shown in FIG. 8, the upper and lower circuit board strips 110, 120, which have been glued together, are placed in a molding apparatus composed of upper and lower molding dies 220, 210 so that each of the circuit boards 112, 122, having semiconductor chips 102, 104 glued thereon, is positioned within cavities 230 of the molding apparatus. Next, the ball lands 127 of the lower circuit boards 122 are pressed with pressing portions 222 formed on the upper molding die 220 through the holes 111, 121 of the circuit board strips 110, 120. As a result, the wirings 128, which are extended into the holes 121 of the lower circuit boards 122, are bent downward and then the ball lands 127 come into contact with the lower molding die 210.

In this state, liquefied molding resin is injected into the cavities 230 through injection openings (not shown) of the molding apparatus and cured to form a package mold 150 as shown in FIG. 4. Then, ball lands 127 of the lower circuit boards 122 are exposed to the lower side of the package mold 150. Subsequently, solder balls 160 are formed on the ball lands 127 exposed to outside. Finally, the circuit board strips 110, 120 are separated into their respective packages 100.

Second Embodiment

Figure 9:
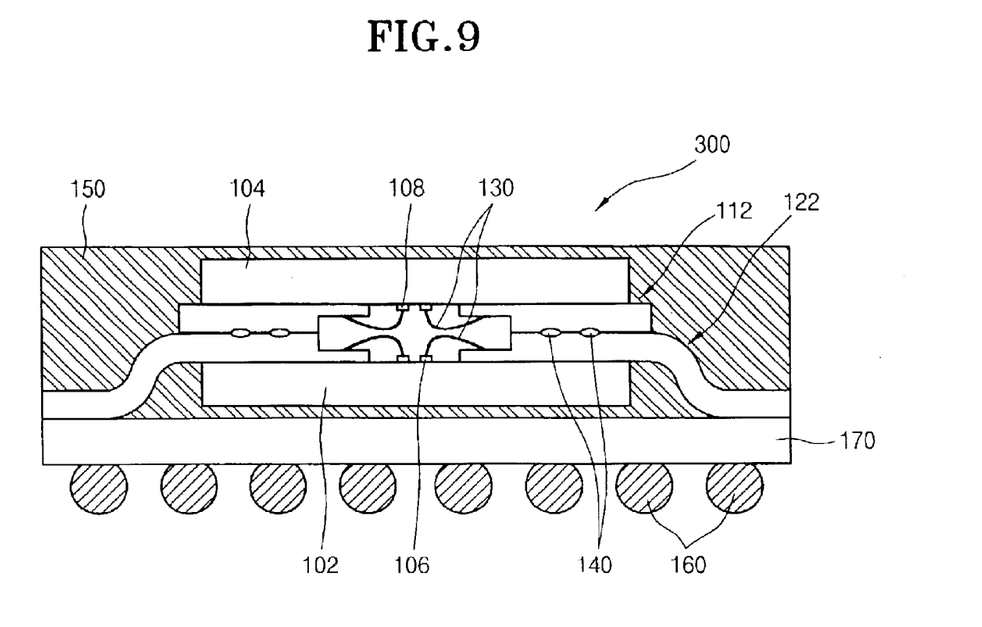
FIG. 9 is a sectional diagram showing a ball grid array package with stacked center pad chips according a second embodiment of the present invention.

FIG. 9 is a sectional diagram showing a ball grid array package with stacked center pad chips 300 according a second embodiment of the present invention. In FIG. 9, the same reference numerals are used to designate the same components as in the first embodiment. Referring to FIG. 9, a separate PCB 170 is used for improved processing, and the opposite ends of the lower circuit board 122 are joined to the PCB 170 to form a package mold 150. Instead of ball lands, solder balls 160 are formed on the lower surface of the PCB 170.

Third Embodiment.

Figure 10:
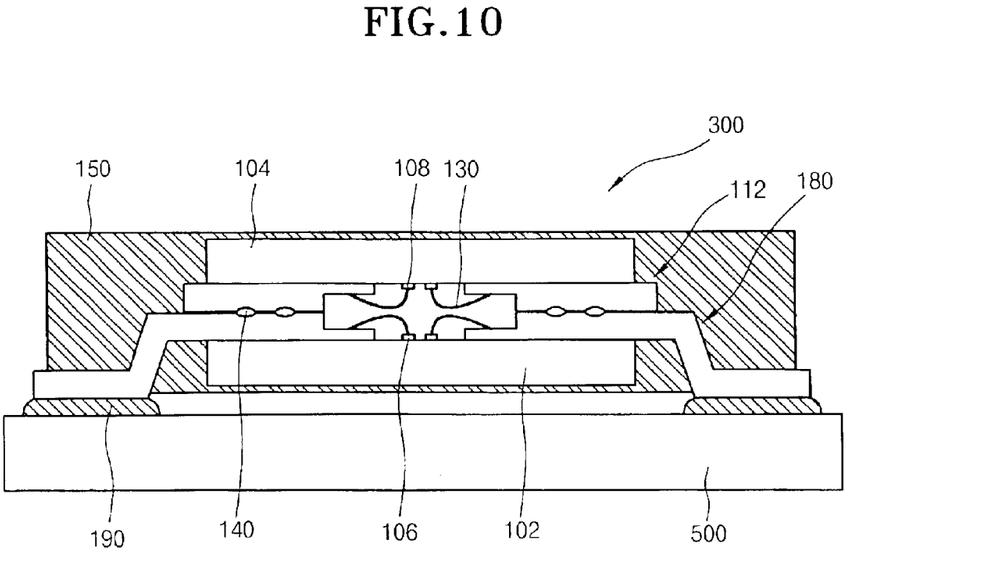
FIG. 10 is a sectional diagram showing a ball grid array package with stacked center pad chips according a third embodiment of the present invention.

FIG. 10 is a sectional diagram showing a ball grid array package with stacked center pad chips 400 according a third embodiment of the present invention. In FIG. 10, the same reference numerals are used to designate the same components as in the first embodiment. Referring to FIG. 10, a lead frame 180 is used instead of a lower circuit board composed of insulation film. Opposite ends of the lead frame 180, exposed out of the package mold 150, are joined to outer board 500 directly via solder pastes 190 instead of solder balls. The outer board 500 is a system board for mounting packages 100, 300, 400. The lead frame 180 used in this embodiment has processed parts set up for connection with a semiconductor chip 102.

As explained above, a ball grid array package with stacked center pad chips according to the present invention can implement a BGA package with stacked chips using center pad type semiconductor chips.

The package according to the present invention is a stacked package capable of increasing memory capacity of a single package by at least 200% and combining both advantages of FBGA packages and of center pad type semiconductor chips.

Moreover, since the semiconductor chips within the package are arranged in a vertically symmetric configuration, warpage of package due to temperature change can be minimized. Particularly, in the case of the first embodiment, although the distance between the center of the package and the outermost solder ball is somewhat large, excellent reliability in joining solder balls can be obtained, since there is no semiconductor chip above the solder balls.

Furthermore, since the molding process is performed while simultaneously bending the lower circuit board, the process of forming solder balls is implemented easily. When the upper and lower circuit boards are connected electrically, they are joined together by bumps formed thereon through thermo-compression bonding. This guarantees high reliability.

Although preferred embodiments of the present invention have been described with reference to drawings and specific terms have been used, this is only for the purpose of explaining technical features of the present invention in general and making understanding easier, and not for limiting the scope of the present invention. Those skilled in the art will appreciate that various modifications, additions and substitutions are possible, without departing from the scope and spirit of the invention as disclosed in the accompanying claims.

What is claimed is:

1. A ball grid array package with stacked center pad chips, comprising:

two center pad type semiconductor chips, each of which having chip pads formed along a central portion of an active surface of each of the semiconductor chips;

upper and lower circuit boards joined together with no gap of a substantial height formed therebetween, the semiconductor chips being attached to each of the upper and lower circuit boards while active surfaces of the semiconductor chips face each other, the chip pads being connected to each of the upper and lower circuit boards through gold wires, wherein the thickness of the portion of each of the upper and lower boards that is connected with the gold wires is less than the thickness of the other portions of each of the boards;

bumps interposed between the upper and lower circuit boards to electrically connect the upper and lower circuit boards with each other; and a package mold in which the upper circuit board is inserted, opposite end portions of the lower circuit board being exposed to a lower side of the package mold.

2. The ball grid array package with stacked center pad chips as claimed in claim 1, wherein the lower circuit board is made of flexible insulation film.

3. The ball grid array package with stacked center pad chips as claimed in claim 2, wherein the exposed opposite ends of the lower circuit board have solder balls formed thereon.

4. The ball grid array package with stacked center pad chips as claimed in claim 2, wherein the opposite ends of the lower circuit board are joined to a printed circuit board.

5. The ball grid array package with stacked center pad chips as claimed in claim 4, wherein solder balls are formed on the lower surface of the printed circuit board.

6. The ball grid array package with stacked center pad chips as claimed in claim 1, wherein the upper circuit board is composed of a lead frame.

* * * * *